United States Patent
Li

(10) Patent No.: US 6,947,258 B1
(45) Date of Patent: Sep. 20, 2005

(54) UV CURABLE AND ELECTRICALLY CONDUCTIVE ADHESIVE FOR BONDING MAGNETIC DISK DRIVE COMPONENTS

(75) Inventor: Weijin Li, San Jose, CA (US)

(73) Assignee: Western Digital (Fremont), Inc., Lake Forest, CA (US)

( * ) Notice: Subject to any disclaimer, the term of this patent is extended or adjusted under 35 U.S.C. 154(b) by 454 days.

(21) Appl. No.: 10/176,016

(22) Filed: Jun. 19, 2002

Related U.S. Application Data

(63) Continuation-in-part of application No. 10/155,598, filed on May 22, 2002.

(51) Int. Cl.$^7$ .............................................. G11B 17/32
(52) U.S. Cl. ................................................. 360/234.6
(58) Field of Search ......................... 360/234.6, 234.5; 252/512, 514

(56) References Cited

U.S. PATENT DOCUMENTS

| | | | |
|---|---|---|---|
| 4,189,298 A | 2/1980 | Shaffer | |
| 4,236,046 A | 11/1980 | De Vries | |
| 4,427,369 A | 1/1984 | Brower | |
| 4,614,778 A | 9/1986 | Kajiura et al. | |
| 4,731,282 A | 3/1988 | Tsukagoshi et al. | |
| 4,999,136 A | 3/1991 | Su et al. | |
| 4,999,146 A * | 3/1991 | Grimes et al. | 264/127 |
| 5,179,171 A | 1/1993 | Minami et al. | |
| 5,654,386 A | 8/1997 | Minami et al. | |
| 5,658,998 A | 8/1997 | Minami et al. | |
| 5,696,652 A | 12/1997 | Satoh | |
| 5,840,215 A | 11/1998 | Iyer et al. | |
| 5,851,644 A | 12/1998 | McArdle et al. | |
| 6,017,587 A | 1/2000 | Kleyer et al. | |
| 6,087,067 A * | 7/2000 | Kato et al. | 430/270.13 |
| 6,210,789 B1 | 4/2001 | Hanrahan | |
| 6,238,597 B1 | 5/2001 | Yim et al. | |
| 6,265,104 B1 | 7/2001 | Hull et al. | |
| 6,447,898 B1 * | 9/2002 | Pfaff | 428/346 |
| 6,529,448 B1 * | 3/2003 | Ishii et al. | 369/13.23 |
| 6,775,101 B2 * | 8/2004 | Satoh et al. | 360/234.6 |
| 2003/0123189 A1 * | 7/2003 | Sato et al. | 360/234.5 |
| 2003/0142444 A1 * | 7/2003 | Tan et al. | 360/234.6 |

FOREIGN PATENT DOCUMENTS

| | | | | |
|---|---|---|---|---|
| JP | 404021450 A | * | 1/1992 | |
| JP | 410175322 A | * | 6/1998 | |
| JP | 2000067421 A | * | 3/2000 | |
| JP | 2000228184 A | * | 8/2000 | |

OTHER PUBLICATIONS

Michael Bailey "The Use of Specialty Acrylic Esters in Cure-In-Place Coating Technology." Sartomer Application Bulletin, Mar. 2001. Exton, PA. USA (copy of web page and in-house white paper).

Sekisui Chemical Co. LTD. "LCD Applications," 2001, htlt://i-front.sekisui.co.jp/fc/eng/html/lcd/lcd 01.html#2.

* cited by examiner

*Primary Examiner*—Allen Cao
(74) *Attorney, Agent, or Firm*—Joshua C. Harrison, Esq.; Carr & Ferrell, LLP

(57) ABSTRACT

An electrically conductive adhesive includes a resin component, a photoinitiator, and metal-coated polymer beads. The beads have an average diameter and a very narrow size distribution around the average diameter. The adhesive is applied between a read/write head and a suspension to attach the two, and the adhesive is cured by exposure to an illumination and/or heat. A pad spacer is included between the read/write head and the suspension to define a spacing and parallelism therebetween. The beads in the adhesive can form one or more layers between the read/write head and the suspension or can be disordered. The metal coating of the beads provide electrical conductivity between the read/write head and the suspension.

34 Claims, 8 Drawing Sheets

UV CURABLE AND ELECTRICALLY CONDUCTIVE ADHESIVE FOR BONDING MAGNETIC DISK DRIVE COMPONENTS

CROSS-REFERENCE TO RELATED APPLICATIONS

This application is a continuation-in-part of copending U.S. patent application Ser. No. 10/155,598, filed May 22, 2002.

BACKGROUND OF THE INVENTION

1. Field of the Invention

The present invention relates generally to the field of magnetic disk drives, and more particularly to an adhesive that is specially adapted to attaching a read/write head to a suspension of a head gimbal assembly within a magnetic disk drive.

2. Description of the Prior Art

Magnetic disk drives are used to store and retrieve data for digital electronic apparatuses such as computers. In FIGS. 1 and 2, a magnetic disk data storage system 10 includes a sealed enclosure 12, a disk drive motor 14, and a magnetic disk, or media, 16 supported for rotation by a drive spindle 17 of motor 14. Also included are an actuator 18 and an arm 20 attached to an actuator spindle 21 of actuator 18. A suspension 22 is coupled at one end to the arm 20 and at another end to a read/write head 24. The suspension 22 and the read/write head 24 are commonly collectively referred to as a head gimbal assembly (HGA). The read/write head 24 typically includes an inductive write element and a magnetoresistive read element that are held in a very close proximity to the magnetic disk 16. As the motor 14 rotates the magnetic disk 16, as indicated by the arrow R, an air bearing is formed under the read/write head 24 causing the read/write head to lift slightly off of the surface of the magnetic disk 16, or, as it is commonly termed in the art, to "fly" above the magnetic disk 16. Data bits can be written or read along a magnetic "track" of the magnetic disk 16 as the magnetic disk 16 rotates past the read/write head 24. The actuator 18 moves the read/write head 24 from one magnetic track to another by pivoting the arm 20 and the suspension 22 in an arc indicated by arrows P. The design of magnetic disk data storage system 10 is well known to those skilled in the art.

The magnetic disk data storage industry has been very successful at deriving ever greater data densities on magnetic disks 16 by pursuing the miniaturization of various components such as the read/write head 24. Along with continued miniaturization has also come ever increasing design tolerances. With particular reference to mounting the read/write head 24 to the suspension 22, miniaturization has created several challenges. First, there is a need to reliably mount the read/write head 24 to the suspension 22 within very strict positional tolerances so that in operation the read/write head 24 flies within a very narrow tolerance range around the optimum height and angle. Second, there is a need to rapidly tack the read/write head 24 to the suspension 22 to reduce processing time and lessen manufacturing costs. Third, there is a need to create an electrical connection between the read/write head 24 and the suspension 22 to dissipate static charges that build up on the read/write head 24 during operation. This third requirement has become increasingly important as read/write heads 24 have been further miniaturized because as the sizes of the read and write elements have become smaller they have also become increasingly susceptible to damage from electrostatic discharge (ESD). Thus, the acceptable voltage difference between the read/write head 24 and the suspension 22 continues to decrease as the size of the read/write head 24 shrinks.

Bonding the read/write head 24 to the suspension 22 is commonly accomplished with adhesives. FIG. 3 illustrates a bonding process that utilizes two adhesives, 30 and 32, placed at opposite ends of the read/write head 24. A drop of a quick-setting adhesive 30 is used to rapidly tack the read/write head 24 to the suspension 22, while a drop of a conductive adhesive 32 is used to provide the electrical connection between the read/write head 24 and the suspension 22. The adhesives 30 and 32 presently in use are not compatible with one another and cannot be allowed to mix, so they must be placed at a sufficient distance from one another.

With respect to the conductive adhesive 32, a variety of alternatives have been tested. The most common technique for creating a conductive adhesive is to load a binder with a conductive filler. The benchmark in the electronics industry is epoxy filled with flakes of silver, commonly referred to as silver epoxy. Silver epoxy requires high curing temperatures in excess of 80° C. and does not cure rapidly, taking in excess of 10 minutes to fully cure. The lengthy curing time makes silver epoxy poorly suited to high throughput automated manufacturing processes.

The quick-setting adhesive 30 includes a ultraviolet (UV) and/or visible photoinitiator and a thermal initiator. When the quick-setting adhesive 30 is exposed to UV illumination the UV photoinitiator causes the quick-setting adhesive 30 to rapidly form an initial bond between the read/write head 24 and the suspension 22. As can be seen in FIG. 3, due to the geometry of the parts, UV illumination can only be directed to the quick-setting adhesive 30 from the sides, and from the bottom through specially placed UV holes, restricting the amount of illumination that can reach the quick-setting adhesive 30. Accordingly, a short exposure to illumination is typically not sufficient to fully cure the quick-setting adhesive 30 and much of the initial bond strength is developed around the periphery of the drop rather than through the interior.

A short initial illumination is, however, typically sufficient to tack the read/write head 24 to the suspension 22. Thereafter, the assembly is baked to activate the thermal initiator to complete the curing of the quick-setting adhesive 30 and to also cure the conductive adhesive 32. It should be noted, however, that as the two adhesives 30 and 32 cure, stresses are developed in the read/write head 24 that can cause it to warp, a process known as crowning. Although the process of using the quick-setting adhesive 30 in conjunction with the conductive adhesive 32 has been heretofore sufficient, it is not viewed as sufficient for ever smaller read/write heads 24. In particular, there is simply less space on a backside surface of a smaller read/write head 24 to place two distinct adhesive drops without allowing them to mix. Further, as read/write heads 24 become smaller and positional mounting tolerances grow tighter, crowning becomes increasingly problematic. Thus, it is desirable to find an adhesive that is both quick-curing and electrically conductive so that the manufacturing process can be reduced to a single drop delivered to the middle of the backside of the read/write head 24.

Another drawback of the present two-adhesive bonding process is that the electrical conductivity of the conductive adhesive 32 decreases as the applied voltage decreases. As read/write heads 24 are made increasingly smaller, as previously noted, lesser amounts of charge become sufficient to create ESD damage. Accordingly, good conductivity is required for smaller voltage differences between the read/write head 24 and the suspension 22. To achieve better conductivity at lower voltages, one solution has been to metallize the backside of the read/write head 24. This can be a multi-step process involving cleaning steps and multiple metal depositions. The metallization process therefore increases the time and the expense of the over-all manufacturing/bonding process.

Towards the more general goal of a UV curable and electrically conductive adhesive, U.S. Pat. No. 4,999,136 issued to Su et al. discloses a UV curable conductive resin. Su et al. discloses a variety of conductive filler materials including metal flakes, metal powders, metal coated glass beads, metal coated flakes, metal coated mica, and mixtures thereof. Although the embodiments taught by Su et al. are suitable for a myriad of applications including chip bonding, electrostatic shielding, electrical contacts, and so forth, none have been found to be well suited for the particular application of bonding a read/write head 24 to a suspension 22. For example, where the filler takes the form of a flake, too great of a percentage of the illumination is blocked and these adhesives do not develop good initial bond strengths. Reducing the loading of the flakes in the epoxy binder increases initial bond strength, but at the expense of conductivity.

On the other hand, metal coated glass beads tend to block less UV illumination, and may actually favorably forward-scatter UV illumination towards the interior of a drop, and therefore can present better initial bonding characteristics. However, metal coated glass beads present other problems in the present context. In particular, cured epoxy filled with glass beads does not retain good conductivity through thermal cycling like that encountered in the typical operating environment. It has been found that the mismatch in coefficients of thermal expansion between the glass beads and the surrounding epoxy binder causes the beads to pull away from the surfaces of the read/write head 24 and the suspension 22 at elevated temperatures leading to a loss of conductivity when it is most needed. The rigidity of the glass beads also creates very limited contact areas with the surfaces of the read/write head 24 and the suspension 22. This further limits conductivity through the cured adhesive, and makes it more likely that contacts will be lost during thermal cycling.

Another problem with metal-coated glass beads is that it is difficult to obtain tightly controlled size distributions for the average particle sizes needed for mounting read/write heads 24 to suspensions 22. FIG. 4 illustrates this problem. As can be seen in FIG. 4, one over-sized bead can create severe misalignment of the read/write head 24 with respect to the suspension 22.

As just noted, proper alignment of the read/write head 24 with respect to the suspension 22 is an important goal of the mounting process. One method for achieving proper alignment is through the use of pad spacers. FIG. 5 shows a plan view of an exemplary arrangement of pad spacers 50 on a bonding surface 52 of a suspension 54. Many other arrangements are known in the art. In some designs the pad spacers 50 each extend to the same height above the bonding surface 52 so that the read/write head 24 can be mounted parallel to the suspension 54. It will be appreciated that by varying the heights of the pad spacers 50 relative to one another, the read/write head 24 can also be mounted at a desired inclination to the suspension 54. FIG. 5 also shows an exemplary placement of a drop of each of a quick-setting adhesive 30 and a conductive adhesive 32 on the bonding surface 52.

FIG. 6 shows a cross-sectional view taken along the line 6—6 in FIG. 5. In some designs, such as the exemplary embodiment shown in FIGS. 5 and 6, the pad spacers 50 are beveled, while in other designs they are not. As can be seen in FIG. 6, the height of the pad spacers 50 defines a separation 56 between the read/write head 24 and the suspension 54. In those designs that vary the relative heights of the pad spacers 50, it can be seen that any height difference between the pad spacers 50 will create an inclination angle between the read/write head 24 and the suspension 54. In some designs the pad spacers 50 are formed of polyimide.

Accordingly, what is needed is a UV curable and electrically conductive adhesive that can achieve a good initial bond strength from a short exposure to UV illumination and that can maintain good electrical conductivity at low applied voltages through periods of thermal cycling.

SUMMARY

An electrically conductive adhesive includes a binder and a filler. The binder includes a resin component and a photoinitiator, and may also include a thermal initiator, an adhesion promoter, and a wetting agent. The resin component can be an oligomer or an unsaturated monomer such as a mono-functional acrylic monomer or a multi-functional acrylic monomer. The photoinitiator can be a visible-light photoinitiator, a UV photoinitiator, or a mixture of visible-light and UV photoinitiators.

The filler is dispersed within the binder and includes metal-coated polymer beads were a ratio by weight of metal-coated polymer beads to the binder is between about 20% and about 80%. In some embodiments the metal-coated polymer beads have an average diameter between about $15\mu$ and about $30\mu$, in other embodiments the metal-coated polymer beads have an average diameter between about $15\mu$ and about $20\mu$, and in still other embodiments the metal-coated polymer beads have an average diameter of about $18\mu$. Preferably, the metal-coated polymer beads have a size distribution around the average diameter of about $1\mu$ or less.

The polymer within the metal-coated polymer beads preferably has a glass transition temperature below room temperature. The polymer can be polystyrene or any other polymer obtained through an emulsion polymerization of a vinyl monomer. The metal layer on the metal-coated polymer beads is a highly conductive and corrosion resistant material such as silver or gold with a thickness between about 200 Å to about 1000 Å. In some embodiments the metal layer includes a seed layer formed of electroless nickel and an outer layer formed of gold.

The invention also includes a head gimbal assembly for a hard disk drive. The head gimbal assembly includes a read/write head attached to a suspension by the electrically conductive adhesive of the invention. In some embodiments the metal-coated polymer beads form a monolayer between the suspension and the read/write head such that a spacing between the suspension and the read/write head is substantially equal to an average diameter of the metal-coated polymer beads. A hard disk drive of the invention includes a rotary magnetic storage disk and the head gimbal assembly of the invention for positioning the read/write head proximate to the magnetic storage disk.

The invention further includes a method for attaching a read/write head to a suspension using a single drop of the adhesive of the invention. The method includes applying the electrically conductive adhesive to a bonding surface of the suspension, pressing the read/write head against the adhesive on the bonding surface, and exposing the adhesive to an illumination. The illumination can include UV and visible light wavelengths to activate the photoinitiator to cause cross-linking in the resin component of the resin. In some embodiments a broad spectrum between about 250 nm and about 500 nm is used with an intensity of between about 1.0 W/cm$^2$ and about 2.0 W/cm$^2$. In other embodiments a visible wavelength around 470 nm is used. By this method the read/write head can be attached to the suspension after an illumination time of less than 2 seconds. In additional embodiments the binder includes a thermal initiator and the method includes a thermal treatment to more fully cure the resin.

DETAILED DESCRIPTION OF THE INVENTION

Figure 1:
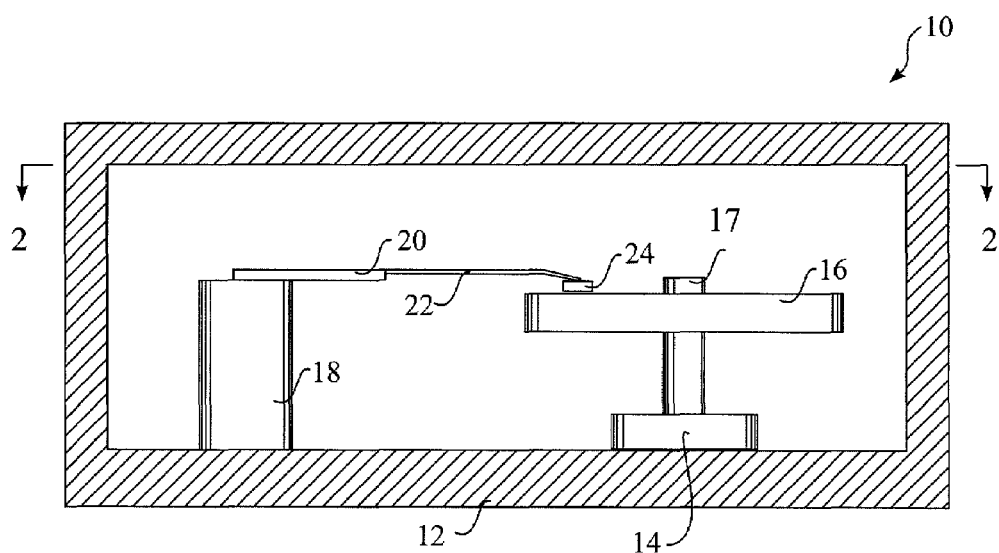
FIG. 1 is a partial cross-sectional view of a magnetic data storage system according to the prior art.
Figure 2:
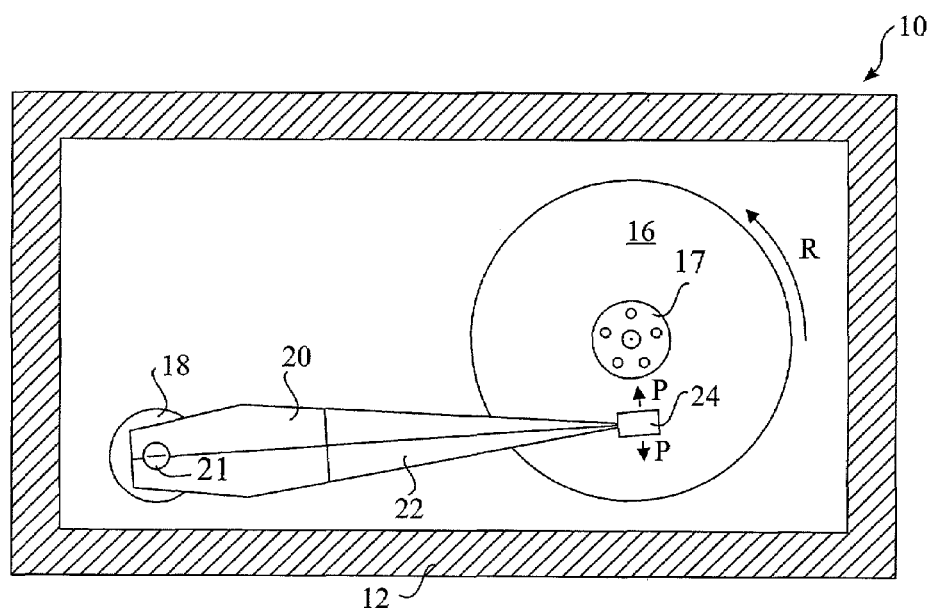
FIG. 2 is a partial cross-sectional view taken along line 2—2 of FIG. 1.
Figure 3:
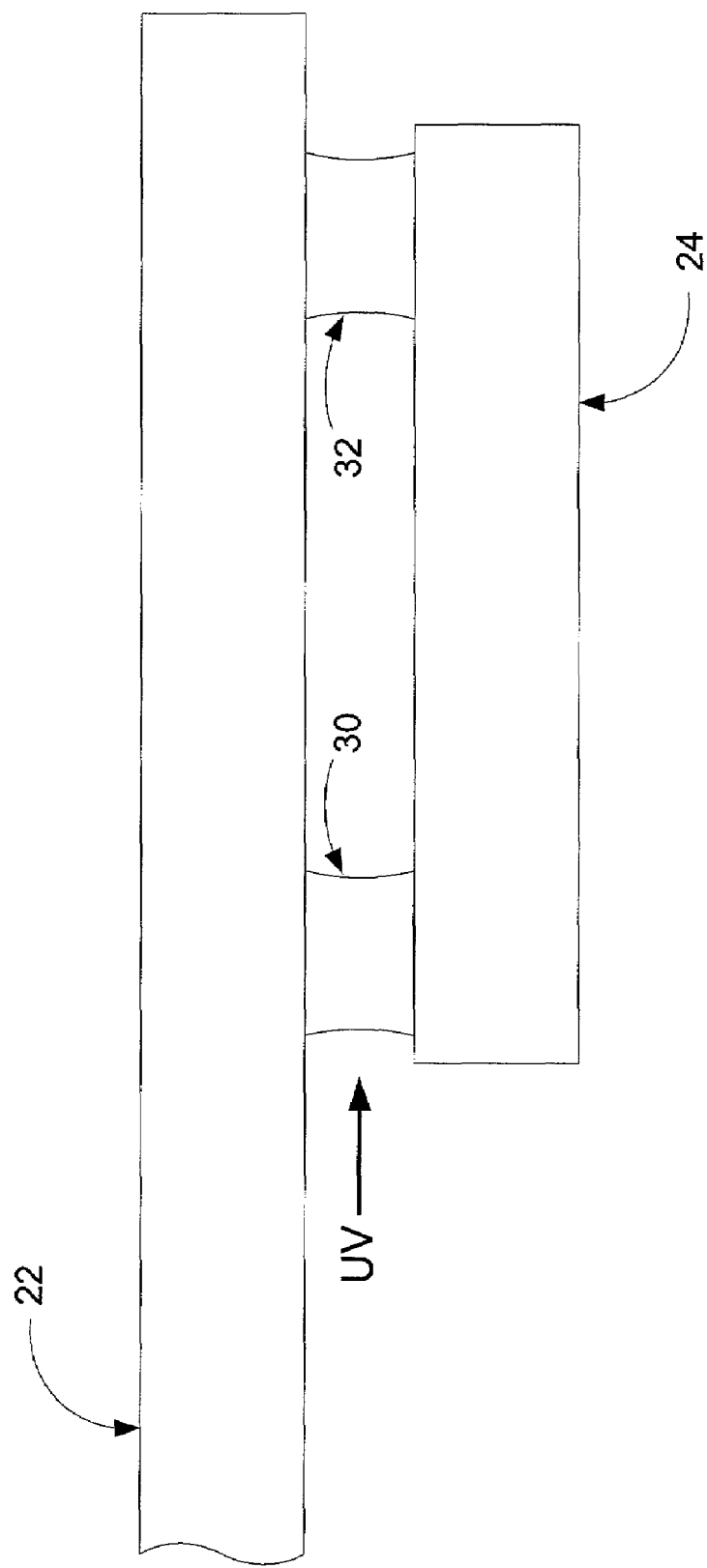
FIG. 3 shows a bonding process using two different adhesives according to the prior art.
Figure 4:
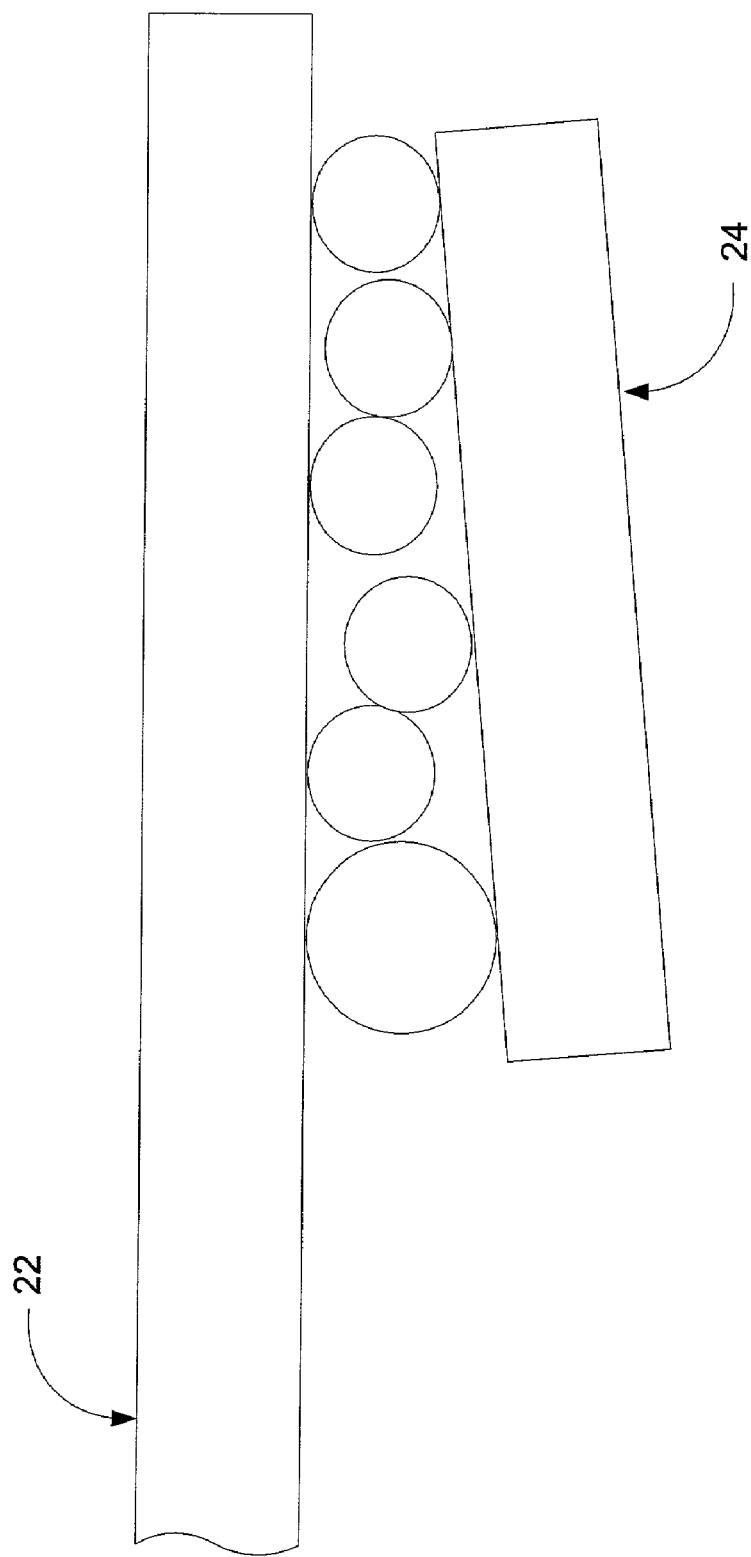
FIG. 4 shows bonding misalignment caused by over-sized filler particles according to the prior art.
Figure 5:
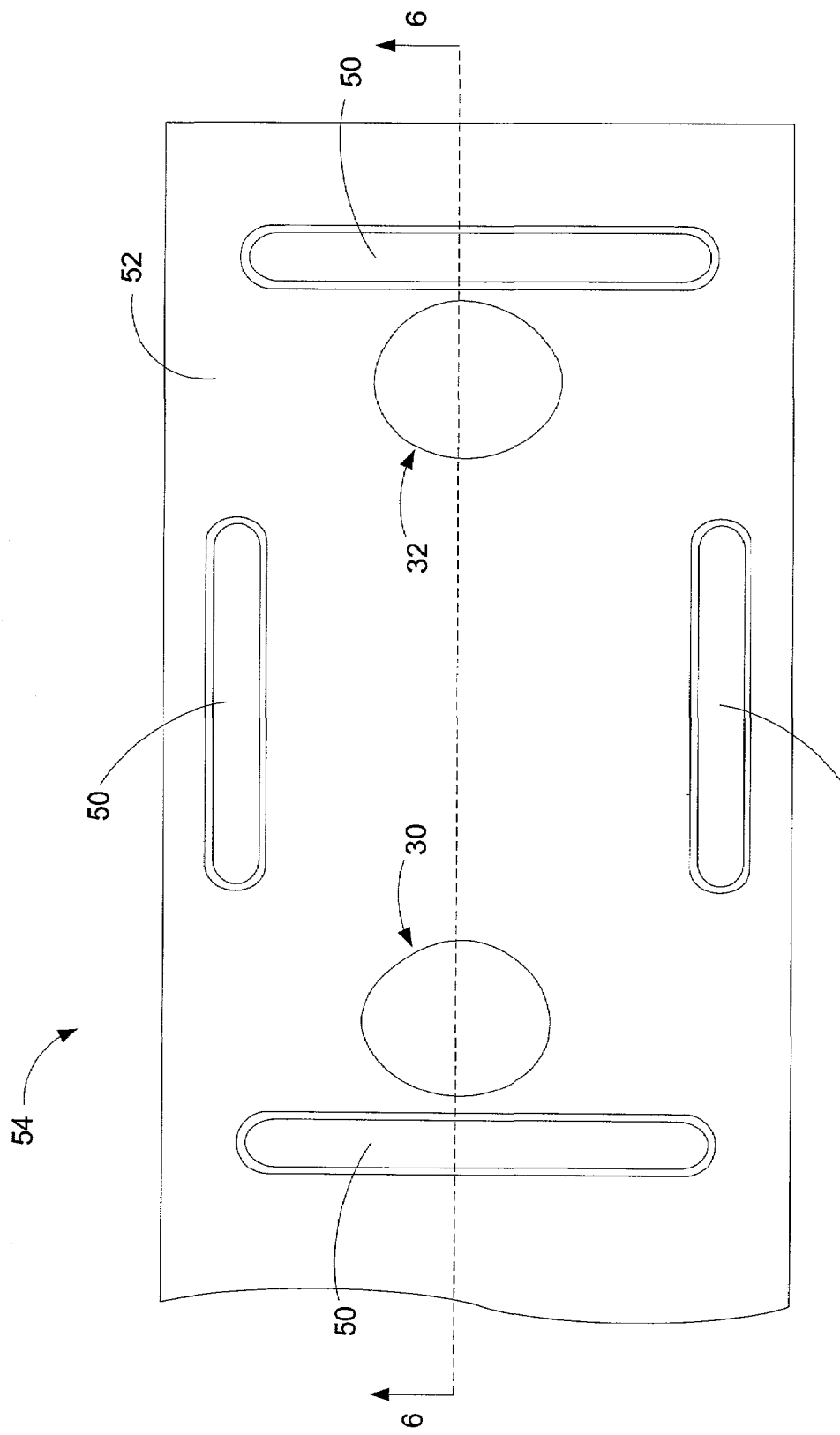
FIG. 5 shows a plan view of an exemplary arrangement of pad spacers on a bonding surface of a suspension according to the prior art.
Figure 6:
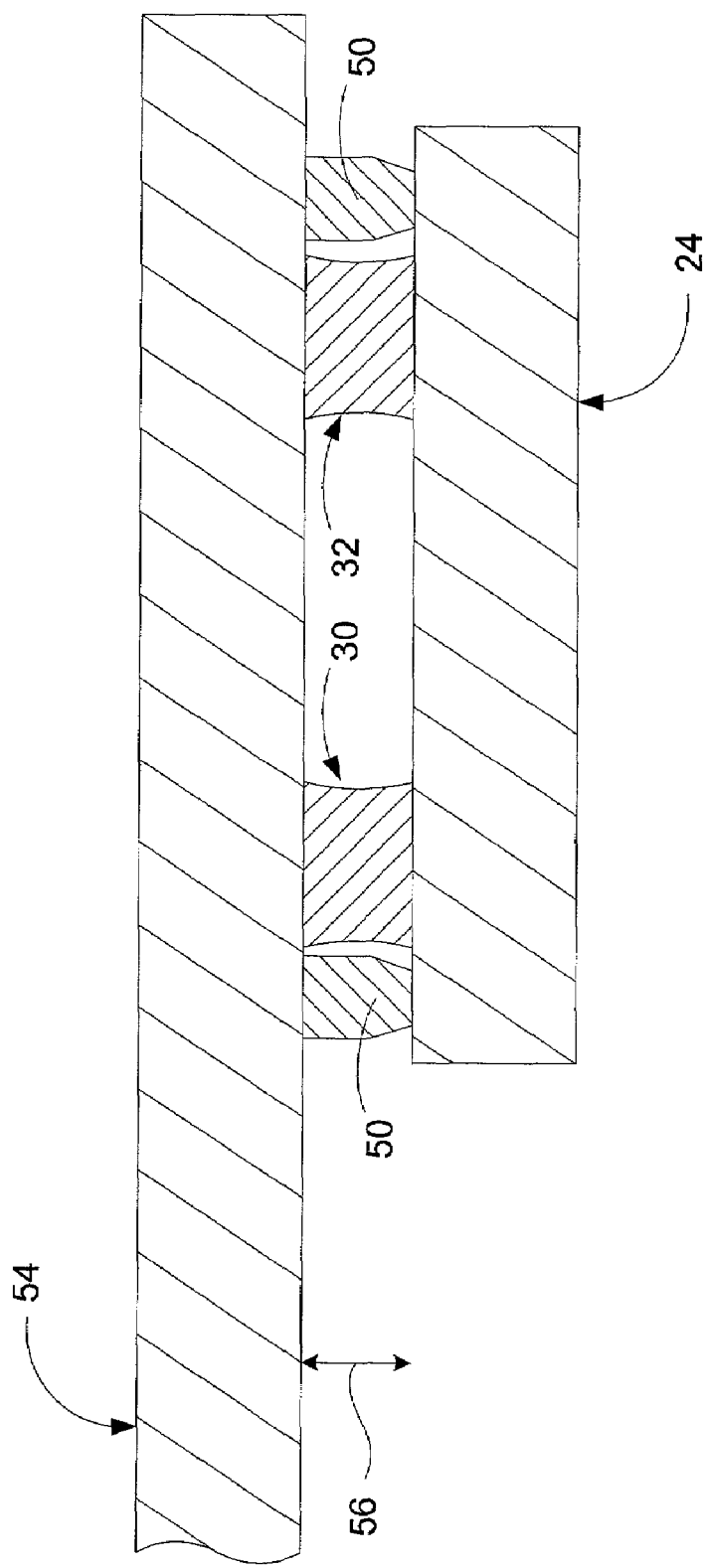
FIG. 6 is a cross-sectional view taken along the line 6—6 in FIG. 5.
Figure 7:
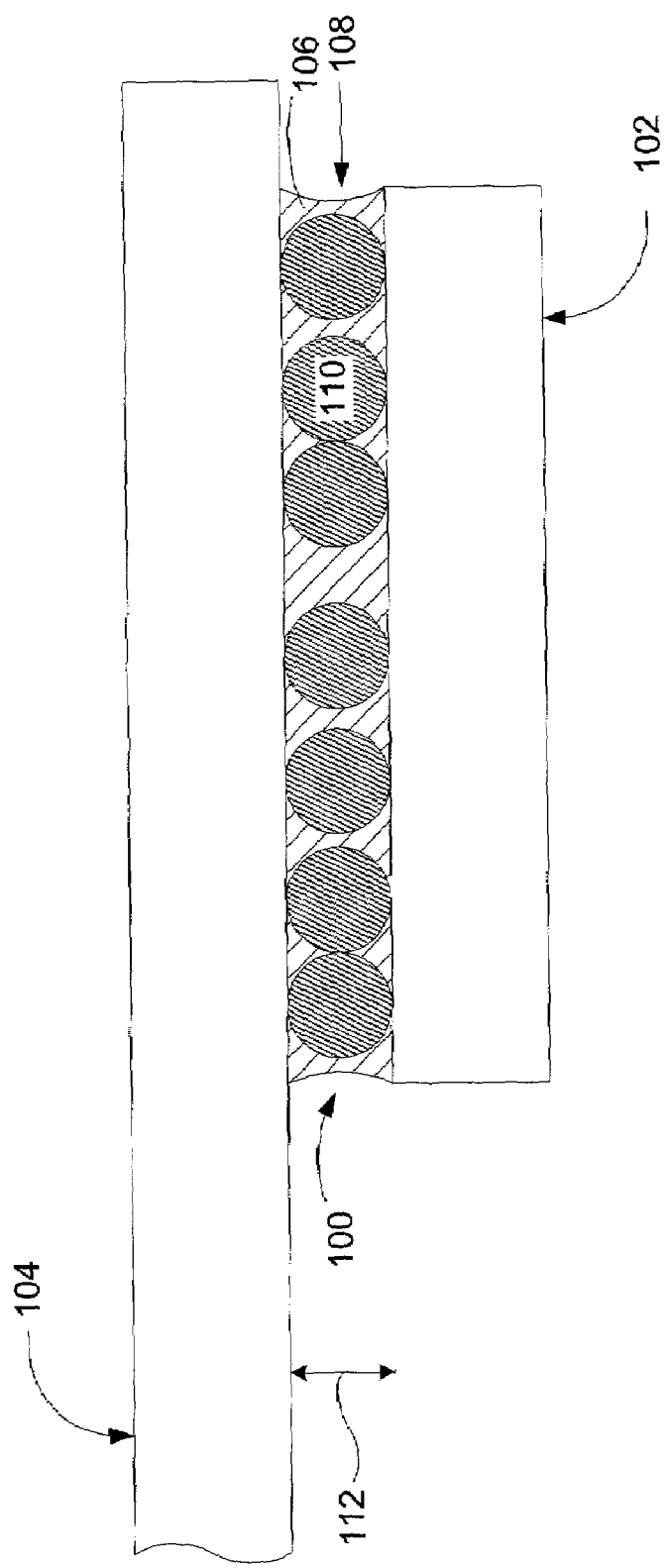
FIG. 7 is a cross-sectional view through an adhesive according to an embodiment of the invention as used to bond a read/write head to a suspension.

FIG. 7 illustrates a cross-section through an electrically conductive adhesive 100 of the invention as used to mount a read/write head 102 to a suspension 104. The electrically conductive adhesive 100 includes a binder 106 and a filler 108 dispersed within the binder 106. The binder 106 includes a resin component and a photoinitiator that causes cross-linking to occur in the resin component upon exposure to illumination with photons having appropriate wavelengths. The filler 108 includes metal-coated polymer beads 110 to provide both electrical conductivity as well as to establish a desired spacing 112 between the read/write head 102 and the suspension 104.

The resin component can be, for example, an unsaturated monomer or an oligomer. Mono- and di-functional acrylic monomers offer a good balance of viscosity, fast reactivity and can quickly develop a high density of cross-links. Suitable mono-functional acrylic monomers for the resin component 106 include allylmethacrylate, tetrahydrofurfurylmethacrylate, isodecylmethacrylate, 2-(2-ethoxyethoxy) ethylacrylate, laurylmethacylate, stearyl methacrylate, lauryl acryalte, 2-phenoxyethyl acrylate, 2-phenoxyethyl methacrylate, isodecyl acrylate, isobornyl methacrylate, tetraethylene glycol dimethacrylate, polyethylene glycol dimethacrylate, diethylene glycol dimethacrylate, 1,6-hexanediol diacrylate, tripropylene glycol diacrylate, and dipropylene glycol diacrylate. Suitable di-functional monomers include tetraethylene glycol dimethacrylate, polyethylene glycol dimethacrylate, diethylene glycol dimethacrylate, 1,6-hexanediol diacrylate, tripropylene glycol diacrylate, and dipropylene glycol diacrylate. Suitable multi-functional acrylic monomers include pentaerythritol triacrylate, ethoxylated trimethylolpropane triacrylate, propoxylated trimethyolopropane triacrylate, propoxylated glyceryl triacrylate, pentaerythritol tetraacrylate, di-trimethylolpropane tetraacrylate, di-pentaerythritol pentaacrylate, and ethoxylated pentaerythritol tetraacrylate.

The resin component can also be, for example, an aliphatic urethane acrylate or an aromatic urethane acrylate. Other candidates for the resin component include epoxy acrylic monomers and oligomers, such as epoxy acrylates, blends of epoxy acrylates and modified epoxy acrylates. Examples of such urethane and epoxy acrylates are available from Sartomer of Exton, Pa. The resin component can also include mixtures of the various compounds listed above. In particular, viscosity and processibility can be adjusted by blending monomers with oligomers.

The binder 106 also includes a photoinitiator that induces cross-linking in the resin component in response to illumination. The binder 106 can also include a thermal initiator to further the cross-linking in response to heating. The photoinitiator can be a visible-light photoinitiator, a UV photoinitiator, or mixtures thereof. Preferred photoinitiators for the invention include one or more UV photoinitiators and can also include one or more visible-light photoinitiators such as Ciba Irgacure 784 (available from Ciba Specialty Chemicals, Basel, Switzerland). Every photoinitiator has a particular maximum absorption wavelength, where the maximum absorption wavelength represents the wavelength of light most strongly absorbed by that photoinitiator. In some embodiments a mixture of two or more photoinitiators having different maximum absorption wavelengths can be used in conjunction with broad spectrum illumination. This will increase the percentage of the total incident energy that is absorbed, thereby causing the resin component to cross-link more rapidly than if only a single photoinitiator were used.

Suitable UV photoinitiators can be of a free radical type and/or a cationic type. Free radical UV photoinitiators include alpha-hydroxy aryl ketone-type compounds such as 1-hydroxycyclohexyl phenyl ketone (e.g., Irgacure 184 from Ciba Specialty Chemicals), 2-benzyl-2,N,N-dimethylamino-1-(4-morpholinophenyl)-1-butanone (e.g., Irgacure 369 from Ciba Specialty Chemicals), 2-hydroxy-2-methyl-1-phenyl propane-1-one (e.g., Darcur 1173 from Ciba Specialty Chemicals), a 50:50 blend of 2-hydroxy-2-methyl-1-phenyl propane-1-one and 2, 4,6-trimethylbenzoyldiphenyl-phosphine oxide (e.g., Darocur 4265 from Ciba Specialty Chemicals), 4-(2-hydroxyethoxy)Phenyl-(2-Propyl)Ketone (e.g., Darocur 2959 from Ciba Specialty Chemicals), an alpha-amino acetophenone derivative such as Irgacure 369 from Ciba Specialty Chemicals, a mixture of 1-hydroxycyclohexyl phenyl ketone and benzophenone such as Irgacure 500 from Ciba Specialty Chemicals, 2,2-dimethoxy-2-phenylacetophenone (e.g., Esacure KB-1 from Sartomer), and trimethylbenzophenone blends (such as Esacure TZT from Sartomer). Cationic UV photoinitiators include triarylsulfonium hexafluoroantimonate salts such as UVI-6974 from Union Carbide, and mixed triaryl sulfonium hexafluorophosphate salts such as UVI-6990 from Union Carbide.

Thermal initiators can include an organic peroxide, for example, soluble peroxides such as benzoyl peroxide, or soluble hydroperoxides such as cumene hydroperoxide. Thermal initiators can include soluble azonitrile compounds such as azobisisobutyronitrile. In some embodiments a mixture of thermal initiators is used.

The binder 106 can also include one or more adhesion promoters and/or wetting agents. Adhesion promoters including silane are good for promoting bonding to hydroxy-rich surfaces. The read/write head 102 is commonly formed of a composite material of aluminum oxide and titanium carbide that presents a hydroxy-rich bonding surface. The suspension 104 is commonly formed of a stainless steel which also presents a hydroxy-rich surface due to the ever-present surface oxidation. Silane-based adhesion promoters can be, for example, beta-(3,4-epoxycyclohexyl) ethyltrimethoxy silane (Silquest A-186 from OSi), gamma-glycidoxypropyltrimethoxy silane (Silquest A-174 from Osi Specialties, Inc., Danbury, Conn.), gamma-aminopropyl trimethoxysilane (Siquest A-1110), or a mixture of ethoxy and methoxy methacrylate silane (Siquest Y-5997). Wetting agents reduce surface tension to promote good spreading characteristics. Suitable wetting agents are available from BYK Chemie of Wesel, Germany.

The filler 108 includes metal-coated polymer beads 110. Metal-coated polymer beads 110 provide several advantages over metal-coated glass beads, the primary advantage being elasticity. In the example shown in FIG. 7, it will be appreciated that electrical conduction between the read/write head 102 and the suspension 104 depends on good contact between the metal-coated polymer beads 110 and the opposing surfaces of the read/write head 102 and the suspension 104. A perfectly spherical and inelastic bead makes contact with a surface at only a single point, but the area of contact is increased to a small circular area if the spherical bead is elastic and compressed against the surface. Thus, the elasticity of the metal-coated polymer beads 110 allows for a larger contact area and therefore better electrical conductivity.

As previously noted in the Background of the Invention, cured epoxy filled with metal-coated glass beads does not retain good electrical conductivity through thermal cycling because a mismatch in coefficients of thermal expansion causes the glass beads to pull away from the surfaces of the read/write head 24 and the suspension 22 at elevated temperatures. However, a metal-coated polymer bead 110 can have a coefficient of thermal expansion that is much more similar to that of the resin component of the binder 106. Thus, metal-coated polymer beads 110 do not pull away from the surfaces of the read/write head 102 and the suspension 104 at elevated temperatures, and therefore the adhesive 100 is able to retain electrical conductivity.

Another advantage of metal-coated polymer beads 110 is that the polymer beads are commercially available in a desirable size range and with a very tightly controlled size distribution around an average. One source of such polymer beads is Polyscience, Inc. of Warrington, Pa. As can be seen in FIG. 7, it is preferable to use a monolayer of metal-coated polymer beads 110 to control the spacing 112 between the read/write head 102 and the suspension 104. Thus, if the diameters of the metal-coated polymer beads 110 have a very narrow distribution around a particular average, then the average diameter of the metal-coated polymer beads 110 can become the spacing 112 when the metal-coated polymer beads 110 are arranged in a monolayer, as shown. It will be appreciated that some variability in the size distribution can be tolerated because the metal-coated polymer beads 110 are elastic and larger ones can deform under loading to be no wider than the average. Average diameters for metal-coated polymer beads 110 can be in the range of about $15\mu$ to about $30\mu$, are more preferably about $15\mu$ to about $20\mu$, and most preferably about $18\mu$ for certain present applications. A suitably narrow size distribution around the average is about $1\mu$ and preferably less than that.

As noted, using polymers for the metal-coated polymer beads 110 allow the metal-coated polymer beads 110 to be elastic. It will be appreciated, however, that not all polymers are elastic within the operating temperature range that the adhesive 100 will be subjected to. Accordingly, it is desirable to select a polymer with a glass transition temperature, $T_g$, that is sufficiently low, where $T_g$ represents the temperature at which the polymer undergoes a phase transition from a low temperature glassy and brittle phase to a high temperature elastic phase. Values for $T_g$ between about $-10°$ C. and $15°$ C. work well.

Suitable spherical polymer beads can be obtained through emulsion polymerization of a variety of different types of vinyl monomers, as disclosed in U.S. Pat. No. 6,277,437. These include (meth) acrylates such as methyl acrylate, ethyl acrylate, butyl acrylate, hexyl acrylate, 2-ethylhexyl acrylate, octyl acrylate, isooctyl acrylate, n-decyl acrylate, isodecyl acrylate, tert-butyl acrylate, methyl methacrylate, butyl methacrylate, hexyl methacrylate, isobutyl methacrylate, isopropyl methacrylate, 2-hydroxyethyl acrylate, acrylamide, sec-butyl methacrylate, cyclohexyl methacrylate, isodecyl methacrylate, isobornyl methacrylate, t-butylaminoethyl methacrylate, stearyl methacrylate, glycidyl methacrylate, dicyclopentenyl methacrylate, and vinyl aromatic monomers such as phenyl methacrylate. The vinyl monomers can also include styrene, p-methyl styrene, methyl styrene, o,p-dimethyl styrene, o,p-diethyl styrene, p-chlorostyrene, isopropyl styrene, t-butyl styrene, o-methyl-p-isopropyl styrene, o,p-dichlorostyrene; conjugated diene monomers such as 1,3-butadiene, isoprene, 1,3-pentadiene, 2-ethyl-1,3-butadiene, and 4-methyl-1,3-pentadiene, 2-methyl-1,3-butadiene, piperylene (1,3-pentadiene) and other hydrocarbon analogs of 1,3-butadiene, and others such as vinylidene chloride and vinyl chloride, acrylic acid, methacrylic acid, fumaric acid, itaconic acid, maleic acid, aconitic acid. The polymer beads can be homopolymers made from the above-mentioned monomers or copolymers made from monomer mixtures thereof. Polystyrene is just one example of an end product of the emulsion polymerization process described above.

The metal-coated polymer beads 110 are preferably coated with a layer of a highly conductive and corrosion resistant material such as gold or silver. A uniform metal plating can be achieved by polymer bead shell metal plating as disclosed in U.S. Pat. Nos. 4,943,355 and 5,036,031. Uniform metal plating can also be achieved through electroplating, and either electro or electroless forms will work. In some embodiments an electroless nickel seed layer is first plated on the polymer beads to promote adhesion followed by an outer coating of silver or gold.

The thickness of the metal layers is a balance between two factors. Making the thickness of the metal layer too thin compromises electrical conductivity. Making the thickness too great causes the metal-coated polymer beads 110 to become too rigid. Accordingly, the seed layer and the outer layer can each be varied in thickness from about 200 Å to about 1000 Å, and both are more preferably about 500 Å thick.

The ratio of metal-coated polymer beads 110 in the binder 106 can be varied between about 20% and about 80% by weight. It will be appreciated that the viscosity of the adhesive 100 will depend on the balance of metal-coated polymer beads 1110 to binder 106 and for different resin compositions different ratios of metal-coated polymer beads 110 to binder 106 will be needed to achieve the same viscosity. It will also be appreciated that other properties vary as a function of the ratio. Electrical conductivity will decrease as the ratio of metal-coated polymer beads 110 to binder 106 decreases, while tack strength, the strength of the bond between the read/write head 102 and the suspension 104 after an exposure to illumination for a set time, will increase. Also, as the ratio decreases there are fewer metal-coated polymer beads 110 to establish the spacing 112, while at the other extreme, too many metal-coated polymer beads 110 in the binder 106 will not easily form a suitable monolayer.

In some embodiments the electrical resistivity of the adhesive 100 after it has been fully cured, as measured between the read/write head 102 and the suspension 104, is less than 1200 Ω for an applied voltage of 1V. To obtain an appropriate resistivity in an adhesive 100 in which other factors dictate a low ratio of metal-coated polymer beads 110 to binder 106, the filler 108 can also include other electrically conductive materials to further increase electrical conductivity. Such additional electrically conductive materials can include metal flakes, metal powders, metal-coated glass beads, metal-coated flakes, metal-coated mica, and mixtures of these materials. It should be noted that electrical conductivity can also improved by metallizing the bonding surface of the read/write head 102.

The invention also includes a method for mounting the read/write head 102 to the suspension 104 using the adhesive 100. The method includes applying adhesive 100 to a bonding surface of the read/write head 102, placing the read/write head 102 against the suspension 104 such that the adhesive 100 spreads between them, applying a compressive force, and curing the adhesive. Applying the adhesive 100 can include dispensing the adhesive 100 from a reservoir as a single drop where the size of the drop is on the order of 2 nanoliters or less. It will be appreciated that although the drop of adhesive 100 is preferably applied to a bonding surface on the suspension 104, it can instead be applied to the read/write head 102. The compressive force is applied to hold the read/write head 102 against the suspension 104 until the adhesive 100 can be cured. A suitable compressive force is less than 2.5 grams.

Curing the adhesive is preferably performed by exposing the adhesive 100 to a source of UV illumination having a broad spectrum between about 250 nm and about 500 nm. UV illumination can be achieved, for example, with a Lesco SuperSpot UV curing unit. The intensity of such UV illumination can be between about 1.0 W/cm$^2$ and about 2.0 W/cm$^2$ to produce a tack time of less than 2 seconds. A visible-light illumination source preferably has a maximum output at around 470 nm. Suitable visible-light sources include xenon lamps and medium mercury lamps.

Curing of the adhesive 100 by exposure to an illumination is sufficient to cross-link the resin component around the periphery of the drop, which itself is enough to tack the read/write head 102 to the suspension 104, but it will be understood that little of the illumination typically will be able to reach the center of the drop. This is especially true where the filler 108 includes additives such as metal flakes that block the penetration of the illumination, as opposed to the forward-scattering created by the metal-coated polymer beads 110. Therefore, curing the adhesive can also include a thermal treatment after the illumination to further cure the adhesive 100. While lower curing times are required at higher curing temperatures, high temperatures tend to be problematic for the magnetic materials within the read/write head 102. Accordingly, a good thermal treatment is about 12 minutes at about 120° C.

Figure 8:
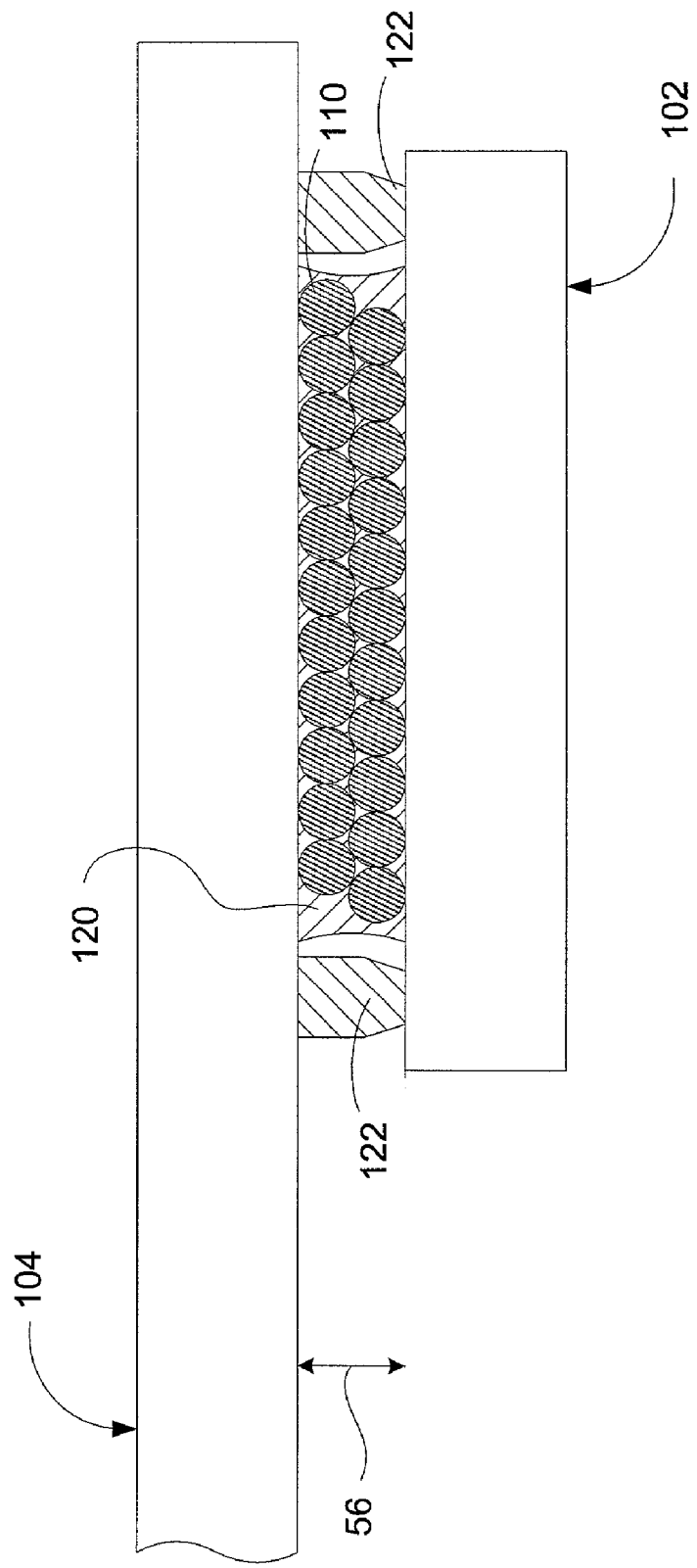
FIG. 8 is a cross-sectional view through an adhesive as used to bond a read/write head to a suspension according to another embodiment of the invention.

Other embodiments of the invention are directed to the use of an adhesive 120 in conjunction with one or more pad spacers 122, as shown in FIG. 8. In these embodiments the adhesive 120 includes one or more layers of metal-coated polymer beads 110. Here, the average diameter of the metal-coated polymer beads 110 is ideally set such that the thickness of n layers equals, or slightly exceeds, the height 56 of the pad spacers 122. In some embodiments the height 56 is about 18μ to about 20μ. Where a single layer (n=1) of metal-coated polymer beads 110 is used in conjunction with pad spacers 122, the average diameter of the metal-coated polymer beads 110 is ideally equal to, or slightly greater than, the height 56. Where two layers (n=2) of metal-coated polymer beads 110 are used, as shown in the embodiment illustrated in FIG. 8, the average diameter of the metal-coated polymer beads 110 will be somewhat greater than half of the height 56 due to the manner in which ordered layers of spheres tend to pack. It is important that the size of the metal-coated polymer beads 110 be carefully selected when using pad spacers 122 because if the metal-coated polymer beads 110 are too small there will be some loss of electrical contact between adjacent metal-coated polymer beads 110 as well as between the metal-coated polymer beads 110 and both of the read/write head 102 and the suspension 104.

Figure 9:
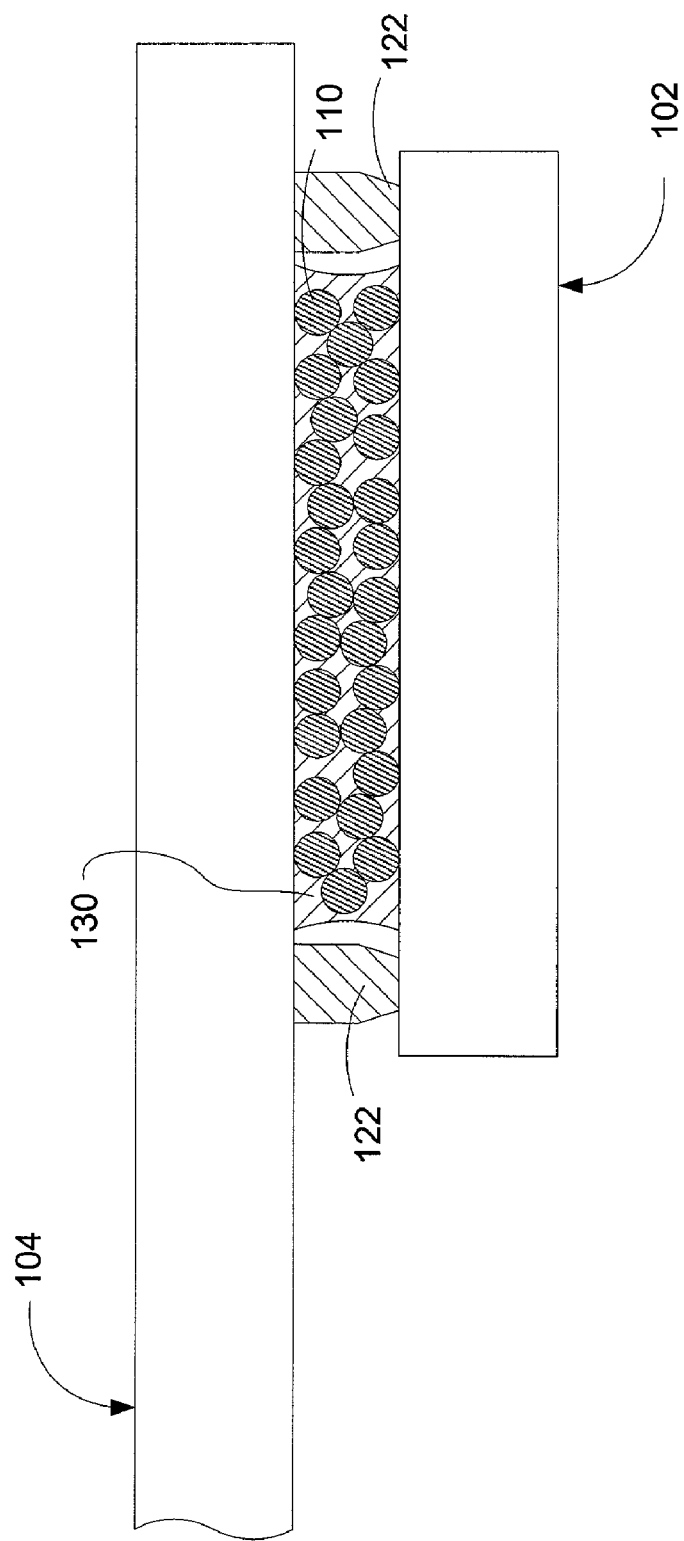
FIG. 9 is a cross-sectional view through an adhesive as used to bond a read/write head to a suspension according to still another embodiment of the invention.

In still other embodiments, illustrated by FIG. 9, an adhesive 130 is used in conjunction with one or more pad spacers 122, however, in these embodiments the metal-coated polymer beads 110 in the adhesive 130 are not layered. It will be appreciated that control over the diameters of the metal-coated polymer beads 110 is not as important in these embodiments. Here, the metal-coated polymer beads 110, although disordered, still create electrical paths between the read/write head 102 and the suspension 104. Electrical conductivity, if less than desired due to the disorderly arrangement of the metal-coated polymer beads 110, can be bolstered by the addition to the adhesive 130 of other electrically conductive materials. As noted above, electrically conductive materials include metal flakes, metal powders, metal-coated glass beads, metal-coated flakes, metal-coated mica, and mixtures thereof.

It should be noted that in the embodiments directed to the use of an adhesive 120, 130 in conjunction with one or more pad spacers 122, the pad spacers 122 can take any number of arrangements so long as they allow sufficient access for illumination to reach the adhesive 120, 130 from both sides. Also, although in FIGS. 8 and 9 the adhesives 120, 130 are shown, for clarity, to be apart from the pad spacers 122, in the invention the adhesives 120, 130 can also wet the side walls of the pad spacers 122.

In the foregoing specification, the invention is described with reference to specific embodiments thereof, but those skilled in the art will recognize that the invention is not limited thereto. Various features and aspects of the above-described invention may be used individually or jointly. Further, the invention can be utilized in any number of environments and applications beyond those described herein without departing from the broader spirit and scope of the specification. The specification and drawings are, accordingly, to be regarded as illustrative rather than restrictive.

What is claimed is:

1. A head gimbal assembly for a hard disk drive comprising:
   a suspension;
   a read/write head attached to the suspension by an electrically conductive adhesive including
      a binder having a resin component and a photoinitiator, and
      a filler having metal-coated polymer beads dispersed within the binder; and
   a pad spacer disposed between the suspension and the read/write head.

2. The head gimbal assembly of claim 1, wherein the metal-coated polymer beads form one or more layers between the suspension and the read/write head.

3. The head gimbal assembly of claim 1, wherein the metal-coated polymer beads are disordered.

4. The head gimbal assembly of claim 1, wherein the resin component includes an unsaturated monomer.

5. The head gimbal assembly of claim 1, wherein the resin component includes an oligomer.

6. The head gimbal assembly of claim 1, wherein the resin component includes a mono-functional acrylic monomer.

7. The head gimbal assembly of claim 1, wherein the resin component includes a di-functional acrylic monomer.

8. The head gimbal assembly of claim 1, wherein the resin component includes a multi-functional acrylic monomer.

9. The head gimbal assembly of claim 1, wherein the photoinitiator includes a UV photoinitiator.

10. The head gimbal assembly of claim 1, wherein the photoinitiator includes a UV photoinitiator and a visible-light photoinitiator.

11. The head gimbal assembly of claim 1 wherein the binder further includes a thermal initiator.

12. The head gimbal assembly of claim 1 wherein the binder further includes an adhesion promoter.

13. The head gimbal assembly of claim 1 wherein the binder further includes a wetting agent.

14. The head gimbal assembly of claim 1, wherein the metal-coated polymer beads include a polymer with a glass transition temperature below room temperature.

15. The head gimbal assembly of claim 1, wherein the metal-coated polymer beads include polystyrene.

16. The head gimbal assembly of claim 1, wherein the metal-coated polymer beads include a layer of a highly conductive and corrosion resistant material.

17. The head gimbal assembly of claim 1, wherein a ratio by weight of metal-coated polymer beads to binder is between about 20% and about 80%.

18. The head gimbal assembly of claim 1 wherein the filler further includes an electrically conductive material selected from the group consisting of metal flakes, metal powders, metal-coated glass beads, metal-coated flakes, metal-coated mica, and mixtures thereof.

19. The head gimbal assembly of claim 1 wherein the pad spacer includes polyimide.

20. The head gimbal assembly of claim 1 wherein the pad spacer has a height of about 18$\mu$ to about 20 $\mu$.

21. A hard disk drive comprising:
   a rotary magnetic storage disk; and
   a head gimbal assembly for positioning a read/write head proximate to the magnetic storage disk and including
      a suspension,
      the read/write head attached to the suspension by an electrically conductive adhesive having
         a binder having a resin component and a photoinitiator, and
         a filler having metal-coated polymer beads dispersed within the binder, and
      a pad spacer disposed between the suspension and the read/write head.

22. A method for attaching a read/write head to a suspension, comprising:
   providing the suspension including a bonding surface and a pad spacer extending from the bonding surface;
   applying to the bonding surface a drop of an electrically conductive adhesive including
      a binder having a resin component and a photoinitiator, and
      a filler having metal-coated polymer beads dispersed within the binder;
   pressing the read/write head against the drop on the bonding surface with a compressive force; and
   exposing the adhesive to an illumination.

23. The method for attaching a read/write head to a suspension of claim 22, wherein the adhesive is applied as a single drop and the single drop of the adhesive is the only adhesive used for said attaching.

24. The method for attaching a read/write head to a suspension of claim 23, wherein the single drop has a volume on the order of 2 nanoliter or less.

25. The method for attaching a read/write head to a suspension of claim 22, wherein a bonding surface of the read/write head is metallized.

26. The method for attaching a read/write head to a suspension of claim 22, wherein the compressive force is no more than 2.5 grams.

27. The method for attaching a read/write head to a suspension of claim 22, wherein the illumination includes a UV wavelength.

28. The method for attaching a read/write head to a suspension of claim 22, wherein the illumination includes a broad spectrum between about 250 nm and about 500 nm.

29. The method for attaching a read/write head to a suspension of claim 22, wherein the illumination has an intensity of between about 1.0 W/cm$^2$ and about 2.0 W/cm$^2$.

30. The method for attaching a read/write head to a suspension of claim 22, wherein the illumination includes a visible wavelength.

31. The method for attaching a read/write head to a suspension of claim 22, wherein the adhesive is exposed to the illumination for less than 2 seconds.

32. The method for attaching a read/write head to a suspension of claim 22, wherein the electrically conductive adhesive further includes a thermal initiator and the method further includes a thermal treatment.

33. The method for attaching a read/write head to a suspension of claim 32, wherein the thermal treatment is for about 12 minutes at about 120° C.

34. A method for attaching a read/write head to a suspension, comprising:
   providing the read/write head including a bonding surface and a pad spacer extending from the bonding surface;
   applying to the bonding surface a drop of an electrically conductive adhesive including
      a binder having a resin component and a photoinitiator, and
      a filler having metal-coated polymer beads dispersed within the binder;
   pressing the suspension against the drop on the bonding surface with a compressive force; and
   exposing the adhesive to an illumination.

* * * * *